(12) United States Patent
Inoue

(10) Patent No.: US 6,765,794 B1
(45) Date of Patent: Jul. 20, 2004

(54) HEAT SINK, MANUFACTURING METHOD THEREOF, AND ELECTRONIC APPARATUS HAVING THE HEAT SINK

(75) Inventor: Koichi Inoue, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/699,570

(22) Filed: Oct. 31, 2000

(30) Foreign Application Priority Data

Mar. 31, 2000 (JP) ........................................ 2000-097782

(51) Int. Cl.⁷ ............................................... H05K 7/20
(52) U.S. Cl. ..................... 361/695; 361/703; 361/704; 361/709; 257/722; 174/16.3; 165/80.3
(58) Field of Search ................................ 361/690, 694, 361/695, 697, 704, 709, 717–719; 257/721, 722; 174/161, 16.3; 165/80.3, 104.33

(56) References Cited

U.S. PATENT DOCUMENTS

| | | | | |
|---|---|---|---|---|
| 5,161,087 A | * | 11/1992 | Frankeny et al. | 361/710 |
| 5,504,650 A | | 4/1996 | Katsui et al. | 361/697 |
| 5,526,875 A | * | 6/1996 | Lin | 165/80.3 |
| 5,559,674 A | | 9/1996 | Katsui | 361/697 |
| 5,630,469 A | * | 5/1997 | Butterbaugh et al. | 165/80.3 |
| 5,650,912 A | | 7/1997 | Katsui et al. | 361/697 |
| 5,867,365 A | * | 2/1999 | Chiou | 361/690 |
| 5,940,267 A | | 8/1999 | Katsui et al. | 361/697 |
| 6,053,242 A | * | 4/2000 | Hsieh | 165/121 |
| 6,067,227 A | | 5/2000 | Katsui et al. | 361/695 |
| 6,075,699 A | * | 6/2000 | Rife | 361/704 |
| 6,125,924 A | * | 10/2000 | Lin | 165/122 |
| 6,260,610 B1 | * | 7/2001 | Biber et al. | 165/80.3 |
| 6,351,382 B1 | * | 2/2002 | Nakanishi et al. | 361/700 |

FOREIGN PATENT DOCUMENTS

| | | |
|---|---|---|
| EP | 0 572 326 | 12/1993 |
| EP | 0 616 366 | 9/1994 |
| EP | 0 893 828 | 1/1999 |
| EP | 0 908 494 | 4/1999 |
| EP | 0 939 442 | 9/1999 |
| EP | 0 939 443 | 9/1999 |
| JP | 6-13364 | 2/1994 |
| JP | 6-268125 | 9/1994 |
| JP | 7-130924 | 5/1995 |
| JP | 9-172282 | 6/1997 |

* cited by examiner

*Primary Examiner*—Boris Chervinsky
(74) *Attorney, Agent, or Firm*—Armstrong, Kratz, Quintos, Hanson & Brooks, LLP

(57) ABSTRACT

It is an exemplified object of the present invention to provide a heat sink, method of manufacturing the same, and electronic apparatus having the heat sink in which a fine and inexpensive adjustment upon placement and replacement may be made to exoergic components having various shapes and calorific values, and to placement space of various shapes and dimensions. The inventive heat sink comprises a housing, a cooling fin that is separably coupled with the housing, receives heal from the exoergic components, and dissipates heat form the exoergic components, and a cooling fan that forcefully cools the cooling fin and is connected with the housing, each element can be replaced alone.

11 Claims, 7 Drawing Sheets

HEAT SINK, MANUFACTURING METHOD THEREOF, AND ELECTRONIC APPARATUS HAVING THE HEAT SINK

BACKGROUND OF THE INVENTION

The present invention relates generally to radiator mechanisms provided in an electronic apparatus, and more particularly to a heat sink, and a manufacturing method thereof, for dissipating heat derived from exoergic circuit components (or heat-producing components) mounted in the electronic apparatus. The electronic apparatuses according to the present invention include portable electronic apparatuses, such as notebook personal computers (PCs), personal digital assistants (PDAs), portable game machines, and various types of drives; space-saving type electronic apparatuses, such as display-integral type and slim type desktop PCs, and word processors; and non-space-saving type desktop PCs and word processors, and further include image-forming apparatuses, such as printers, facsimile units, and photocopiers. The present invention is suitable, for example, for a radiator mechanism for various types of circuit components mounted on a motherboard in the notebook PC or the like.

The notebook PC is broadly available in the market as a typical portable electronic information terminal. The motherboard (or main board) in the notebook PC is mounted with the circuit components such as a CPU socket, a variety of memory (sockets), a chipset, an expansion slot, and a BIOS ROM, and directly affects performance and functionality of the PC.

The notebook PCs in recent years tend to include an increased number of exoergic components and to generate more calorific values from the various circuit components as the circuit components mounted on the motherboard provide higher speed and higher performance. Therefore, in order to thermally protect the exoergic components and other circuit components mounted directly or via a socket, or the like, on the motherboard, the motherboard is provided with a cooler, called a heat sink.

The heat sink typically includes a cooling (or radiating) fin made up of many high-thermal-conductivity members (fin assembly), and cools exoergic components by spontaneous air cooling. However, the calorific values from exoergic components tend to become too high in recent years to be adjusted by the spontaneous air cooling. Therefore, a fan-cum-heat sink further including a cooling fan has been proposed to enhance a cooling effect of the heat sink. The fan-cum-heat sink provides forced-air cooling to the heat sink utilizing air currents produced by a fan. A conventional fan-cum-heat sink is typically provided above a CPU on the motherboard, as the calorific value from the CPU is the highest among other components.

The fan-cum-heat sink is formed by a die casting process integrally with a cooling fin, a base that forms a bottom surface of the cooling fin to allow heat to conduct from exoergic components to the cooling fin, and a storage portion that accommodates the cooling fan, in order to achieve miniaturization and improved stiffness. Such an integral type heat sink may conduct heat efficiently via a connecting surface (heat-receiving surface) between the exoergic components and the base to the cooling fin, and thus exhibits high thermal exchange performance. Another fan-cum-heat sink has also been proposed that is designed to place the cooling fin and the cooling fan in the same plane (e.g., the cooling fins around the cooling fan). Such a placement is suitable for recent notebook PCs required to be made thin (or low-profile).

However, the conventional integral type fan-cum-heat sinks have limitations on fine adjustments when placed with respect to the exoergic components having various shapes and calorific values, and to placement spaces having various shapes and dimensions. Beyond adjustment are, for example, a large cooling fan that is required for use to enhance cooling efficiency, a cooling fin that is made of copper instead of aluminum or has a differently shaped fin assembly constituting the cooling fin to change cooling efficiency, and a housing having a different shape and dimension to conform to the shape and dimension of exoergic components and placement space. In all the above cases, however, the conventional integral type fan-cum-heat sinks uneconomically need replacement of the whole heat sink. For example, the cooling fan cannot be replaced for a larger one if the cooling fin is located around the cooling fan, and the shape of the housing cannot be altered while the cooling fin and the cooling fan are kept unchanged. Furthermore, in many instances, only the cooling fin in the fan-cum-heat sink made by aluminum die casting cannot be changed into a fin made of copper. This consequently requires different heat sinks to be designed for each electronic apparatus, and also brings about an increase in the costs of the electronic apparatuses.

Similarly, the conventional integral type fan-cum-heat sinks are uneconomical in that the whole heat sink needs replacing even when one of the components is damaged.

BRIEF SUMMARY OF THE INVENTION

Therefore, it is an exemplified general object of the present invention to provide a novel and useful heat sink, a manufacturing method thereof, and electronic apparatus having the heat sink in which the above disadvantages are eliminated.

Another exemplified and more specific object of the present invention is to provide a heat sink, a manufacturing method thereof, and electronic apparatus having the heat sink in which a fine and inexpensive adjustment upon placement and replacement may be made to exoergic components having various shapes and calorific values, and to placements spaces of various shapes and dimensions.

In order to achieve the above objects, a heat sink as one exemplified embodiment of the present invention comprises a housing, and a cooling fin that is separably coupled with the housing, receives heat from an exoergic part, and dissipates heat from the exoergic part. Alternatively, the heat sink comprises a housing, and a base portion separably coupled with the housing, and including an heat-receiving surface that receives heat from an exoergic part, and a cooling fin that is formed on the back of the heat-receiving surface, and dissipates heat from the exoergic part. Further, the cooling fin is removable from the base portion. This heat sink has the housing and the cooling fin separable, and thus the housing or the cooling fin may be easily replaced separately. Furthermore, since the cooling fin and the base portion are separable from each other, each element may be easily replaced alone. The term 'replace' as used herein includes operations carried out not only when a damaged housing or cooling fin is to be changed, but also when a material or shape thereof is to be changed (e.g., the material of the cooling fin is changed from aluminum to copper, the shape of a fin assembly constituting the cooling fin is changed, or the like).

The above heat sink may further comprise a cooling fan that cools the cooling fin, and is connected with the housing, whereas the cooling fan and the cooling fin may be disposed in the same plane. In that event, the heat sink (fan-cum-heat sink) may have an enhanced cooling capability, and dispose the cooling fin and the cooling fan in the same plane, thereby contributing to a slimmed body of the heat sink itself.

A housing as one exemplified embodiment of the present invention characteristically includes a storage portion that separably accommodates a cooling fin that dissipates heat from an exoergic part in order to dissipate heat. This housing is formed in isolation from the cooling fin, and may thus be designed arbitrarily according to the size and shape of the placement space in the electronic apparatus, and the housing and the cooling fin may be independently developed.

The above housing may further accommodate in the storage portion a cooling fan that cools the cooling fin, and may dispose the cooling fan and the cooling fin in the same plane. In that event, the housing disposes the cooling fin and the cooling fan in the same plane, thereby contributing to a slimmed body of the housing itself.

A cooling fin as one exemplified embodiment of the present invention comprises a fin assembly including a plurality of fins that dissipate heat from an exoergic part, a connection portion that connectes the fin assembly with a housing including a storage portion, the storage portion separably accommodating the fin assembly. This cooling fin is formed in isolation from the housing, and may thus be designed arbitrarily according to the size and shape of the exoergic part, or the size and shape of the placement space, or the like, and the housing and the cooling fin may be independently developed. Moreover, the cooling fin may further include a base portion that forms a heat-receiving surface.

A method of manufacturing a heat sink as one exemplified embodiment of the present invention comprises the steps of forming a housing, forming a base portion that includes a cooling fin, and is separably coupled with the housing, and separably connecting the housing and the base portion with each other. This manufacturing method separately manufactures the housing and the base portion independently, and combines them, and thus if each element has plural kinds different in size, shape, and material, may be selected arbitrarily among them, whereby heat sinks having different cooling capabilities may be manufactured. The above step of forming the base portion may employ a forging or stamping process to form the cooling fin. These processes may form an accurate and hard base portion.

The above method of manufacturing a heat sink may further comprise the step of mounting a cooling fan in the housing, and in this step, the cooling fan and the cooling fin may be disposed in the same plane. In that event, the heat sink disposes the cooling fin and the cooling fan in the same plane, thereby contributing to a slimmed body of the heat sink itself.

An electronic apparatus as one exemplified embodiment of the present invention comprises a printed board on which an exoergic part is mounted, and a heat sink that is provided on the printed board, and cools the exoergic part, and the heat sink characteristically comprises a housing, and a cooling fin that is separably coupled with the housing, receives heat form the exoergic part, and dissipates heat from the exoergic part. Moreover, the electronic apparatus may further comprise a cooling fan that cools the cooling fin, and is connected with the housing, whereas the cooling fan and the cooling fin may be disposed in the same plane. This electronic apparatus includes the above-described heat sink, and thus each element may easily be replaced alone, whereby requirements for a fine and inexpensive adjustment to requirements of N the electronic apparatus may be satisfied.

Other objects and further features of the present invention will become readily apparent from the following description of the embodiments with reference to accompanying drawings.

DETAILED DESCRIPTION OF INVENTION

Figure 1:
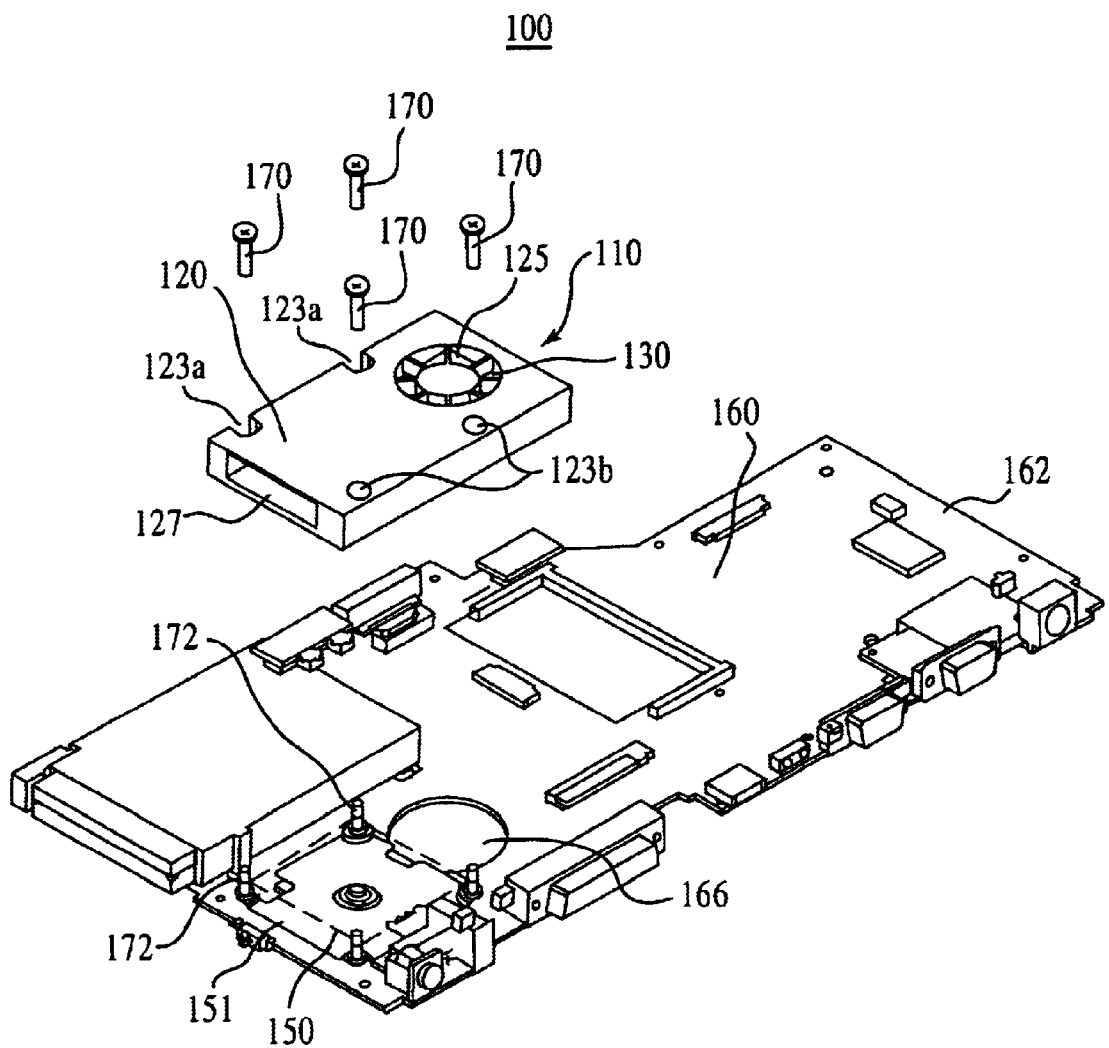
FIG. 1 is an exploded perspective view of a radiator mechanism as one exemplified embodiment of the present invention.
Figure 2:
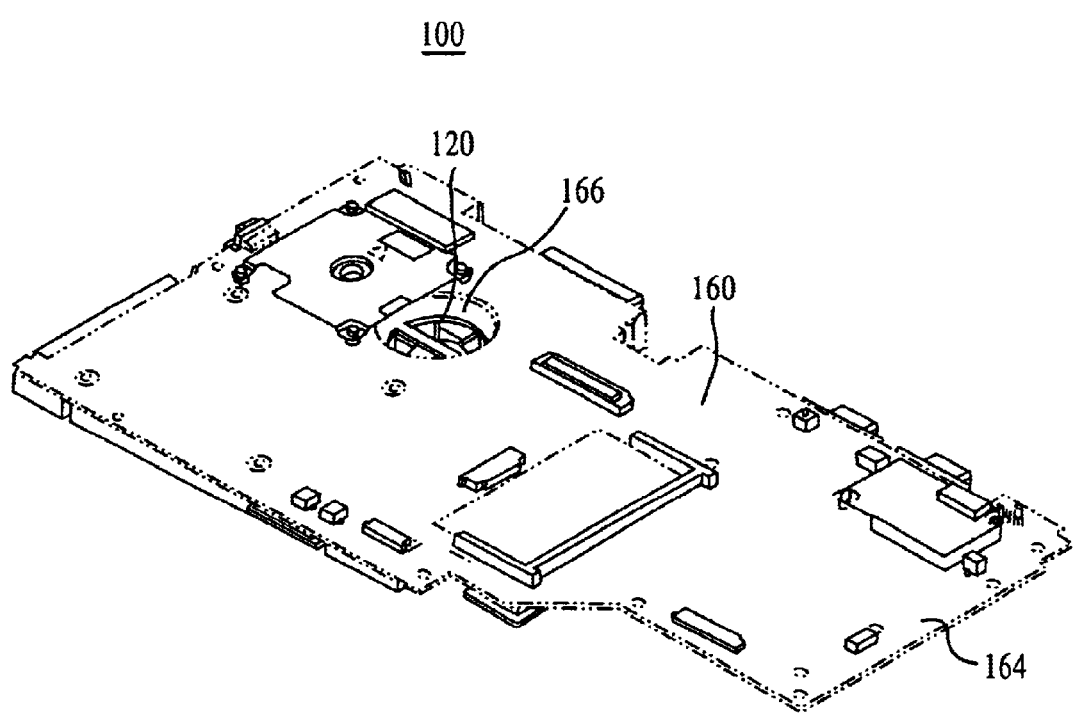
FIG. 2 is a perspective view of a motherboard in the radiator mechanism shown in FIG. 1 as viewed from a back thereof.
Figure 3:
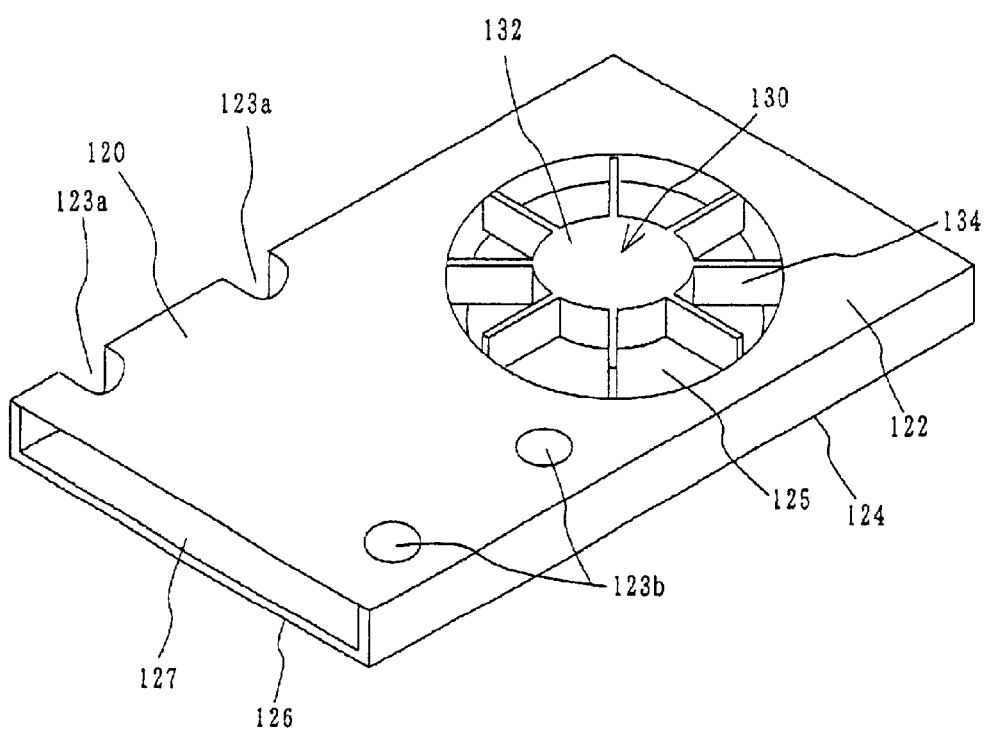
FIG. 3 is a magnified perspective overview of a fan-cum-heat sink in the radiator mechanism shown in FIG. 1.
Figure 4:
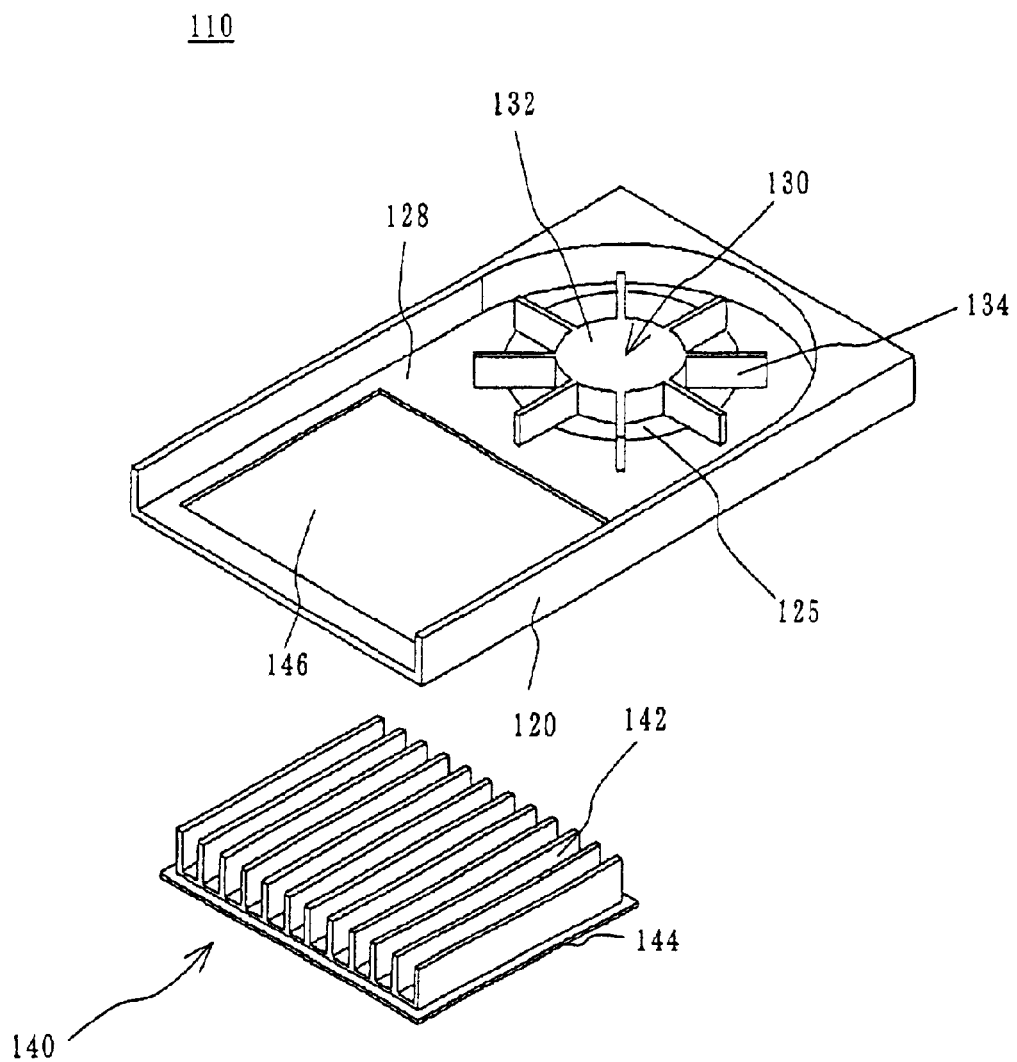
FIG. 4 is a perspective view for illustrating an inside of the fan-cum-heat sink shown in FIG. 3.

Referring now to FIGS. 1 to 4 inclusive, a description will be given of a radiator mechanism 100 having a fan-cum-heat sink 110 as an exemplified embodiment of the present invention. The radiator mechanism 100 in the present embodiment is comprised mainly of the inventive fan-cum-heat sink 110. Optionally, as an element of the radiator mechanism 100, a motherboard 160 provided with a through hole 166 may be added. The radiator 100 includes at least a cooling fin 140. FIG. 1 is an exploded perspective view of the radiator mechanism 100 as an exemplified embodiment of the present invention. FIG. 2 is a perspective view for illustrating a back surface of the motherboard 160. FIG. 3 is a magnified perspective overview for showing the fan-cum-heat sink 110 shown in FIG. 1. FIG. 4 is an exploded perspective view for illustrating an inside of the fan-cum-heat sink as one exemplified embodiment of the present invention.

The radiator mechanism 100 in the present embodiment utilizes the fan-cum-heat sink 110 for a CPU 150 (or MPU: both terms indicate a processor in a broad sense; hereinafter used in a like manner) represented by a dotted line in FIG. 1. The fan-cum-heat sink 110 for the CPU 150 is provided on the CPU 150 in such a manner as to get in thermal contact with the CPU 150 to cool the CPU 150. The radiator mechanism 100 may as necessary include the motherboard 160 provided with the through hole 166. The fan-cum-heat sink 110 includes a housing 120, a cooling fan 130, and a plurality of the cooling fins 142 (see FIG. 4).

The housing 120 is an approximately rectangular parallelepiped frame composed, for instance, of aluminum, copper, aluminum nitride, artificial diamond, plastic, or other high-thermal-conductivity materials, and includes a top surface 122, mounting grooves 123a, mounting holes a bottom surface 124, an intake 125, an end surface 126, an exhaust port 127, and a storage portion 128. Further, the bottom surface 124, referring to FIG. 4, includes a base portion 144 joined with plate-shaped fins 142. The bottom surface 124 and the base portion 144 are preferably made flat to reduce a contact thermal resistance with the CPU 150. The heat sink 110 is manufactured by sheet metal working, aluminum die casting, or other processes. The housing 120, if made of plastic, may be formed, for example, by injection molding. A part of the housing 120 (e.g., a cooling fan 130 and a cooling fin 140) may be configured to be separable.

The intake 125 is, to be specific, provided as holes on both sides at a top surface 122 and a bottom surface 124 of the housing 120. As shown in FIG. 3, the intake 125 is pierced through the top surface 122 and the bottom surface 124. To make the matter more intelligible, referring to FIG. 4, the bottom surface 124 proves to be also provided with the intake 125. The fan-cum-heat sink 110 (as shown in FIGS. 1 and 3) can take in air from the both sides of the top and bottom surfaces 122 and 124 of the heat sink 110.

For convenience of replacement and maintenance of the cooling fan 130 and/or the cooling fin 140, the top surface 122 of the housing 120 is preferably configured to be like a lid removable from a main body including the bottom surface 124. Alternatively, a lidless heat sink as shown in FIG. 4 may be used instead of the heat sink shown in FIG. 1, but it is preferable to provide such a lid portion to reduce noise generated by rotation of the cooling fan 130. Moreover, as shown in FIG. 4, the inventive fan-cum-heat sink 110 allows the cooling fin 140 to be removed from the bottom surface 124. In other words, the bottom surface 124 and the cooling fin 140 for the inventive fan-cum-heat sink 110 are separately manufactured.

The housing 120 accommodates the cooling fan 130 and the cooling fin 140 in the storage portion 128. The storage portion 128 includes a semicircular portion 128a for storing the cooling fan 130, and a rectangular parallelepiped portion 128b for storing the cooling fin 140. The storage portion 128 also serves as a wind tunnel to provide space through which airflow generated by the cooling fan 130 passes. The housing 120 may also dissipate heat from a surface thereof, and thus if necessary may make the top and bottom surfaces 122 and 124, and other surfaces protuberantly shaped so as to increase surface areas, thereby enhancing dissipation effects.

As in FIG. 1, the mounting grooves 123a and mounting holes are pierced through the top and bottom surfaces 122 and 124, and are engaged with screws 170. The screws 170 may have a hollow body so as to be engageable with pins 172 pierced through a socket 151 for placement of the CPU 150 as provided on the motherboard 160. The socket 151 makes the CPU 150 exchangeable. Alternatively, the screws 170 are pierced through the holes (not shown) on the motherboard 160 and fastened on the motherboard 160, if needed, via nuts (not shown) or the like. As a result, the housing 120 is secured on the motherboard 160 through the mounting grooves 123a and the mounting holes and the screws 170. However, any means for thermally connecting the housing 120 and the CPU 150 is acceptable. For instance, both elements may be bonded with a thermally conductive adhesive or by soldering (with solder paste and a reflow oven, or otherwise), or fastened by coil springs each looped over a portion projected from the mounting grooves 123a and the mounting holes 123b upon insertion of mounting pins each having a slit head from a surface 164 that will be described later on the motherboard 160.

As shown in FIGS. 1, 3, and 4, the intake 125 is pierced through the top and bottom surfaces 122 and 124 to connect the cooling fan 130 to the outside. Otherwise, the intake 125 may be connected to the through hole 166 that will be described later in the motherboard 160. An end surface 126 includes the exhaust port 127, which is connected to the cooling fan 130 and the cooling fin 140. The intake 125 serves to introduce hot air derived from exoergic components mounted broadly on the motherboard 160 as well as from heat generated in the CPU 150 into the housing 120.

As a result, the intake 125 can introduce, on the top and bottom surfaces 122 and 124, hot air located at a side of the surface 162 that will be described later of the motherboard 160 into the housing 120, and can introduce, on the bottom surface 124, hot air located at a side of the surface 164 that will be described later of the motherboard 160 via the through hole 166 into the housing 120. In other words, the hot air can be introduced into the housing 120 from the both sides (the surfaces 122 and 124) of the cooling fan 130. The introduced hot air is supplied to the cooling fin that will be described later by the cooling fan 130, and after heat exchange, ejected through the exhaust port 127. The introduced hot air is cooled by the heat exchange. The exhaust port 127 is connected to sheet metal for heat radiation (not shown) incorporated in a side portion 225 of the notebook PC 200 that will be described later or to a vicinity of the exhaust port 127 provided on the side portion 225. As described above, heat in the air is also dissipated from a surface of the housing 120.

The intake 125 is so large as to expose the cooling fan 130 in whole in the present embodiment, but the size may be set arbitrarily. The intake 125 may be comprised of a plurality of holes (e.g., assuming a mesh structure), if necessary. Further, the intake 125, though provided on both of the top and bottom surfaces 122 and 124 in FIG. 3, may be provided on either one surface only.

If required, the housing 120 may include a hollow bottom portion having the bottom surface 124, in which cooling water or other refrigerants (e.g., Freon, alcohol, ammonia, galden, and fron) are contained to form a heat pipe plate. In addition, inserting a mesh (or wick) in the hollow portion, which induces a capillary phenomenon thereby circulating cooling water, would be further effective. Moreover, the housing 120, if necessary, may be connected with an external heat pipe, or the like. This heat pipe may include a pipe that is made of aluminum, stainless steel, copper, or the like, and formed so as to have portions varied in height. The pipe has a wick material made of glass fiber, reticular thin copper wire, or the like affixed inside, and under reduced pressure, stores cooling water or other refrigerants. The cooling water cools exoergic elements by repeating the following cycle: having obtained heat from the exoergic elements in a lower position, the cooling water is vaporized and moves up to a higher position, and then is spontaneously or forcefully cooled in the higher position, liquefied, and returns to the lower position.

Figure 8:
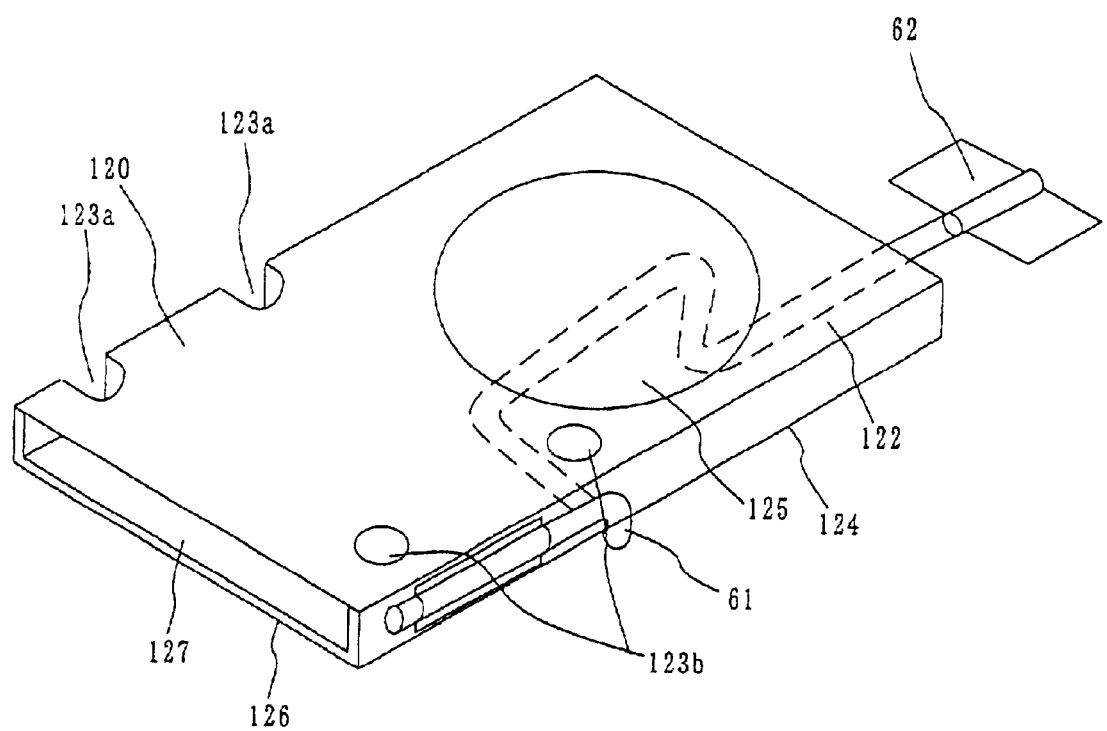
FIG. 8 is a schematic perspective view of the fan-cum-heat sink as another exemplified embodiment of the present invention.

As another embodiment, optionally, a heat pipe 61 connected with a fan-cum-heat sink 110 may be extended to a back surface 164 of the motherboard 160 using the through hole 166. This embodiment is shown in FIG. 8. To a side surface of the fan-cum-heat sink 1100 shown in FIG. 8 is coupled the heat pipe 61. The heat pipe 61 extends from the front surface 162 of the motherboard 160 via the through hole 166 to the back surface 164 of the motherboard 160. In a dotted portion of the heat pipe 61 in FIG. 8, a portion under the intake 125 passes through the through hole 166 of the motherboard 160. The motherboard 160 is not illustrated in FIG. 8. The heat pipe 61 is coupled with exoergic elements such as electronic components in a position indicated by 62 in the drawing at the back surface 164, and transfers heat derived therefrom to the fan-cum-heat sink 1100. Accordingly, the heat conducted via the heat pipe 61 is dissipated using the cooling fan 130. This configuration allows the through hole 166 to double as an intake from the back surface 164 and a placement of the heat pipe. A structure of the fan-cum-heat sink 1100 in FIG. 8 is the same as the fan-cum-heat sink 110 in FIGS. 1, 3, and 4 except coupling of the heat pipe 61. Therefore, an illustration of the cooling fan 130 and the like is omitted. Since the heat sink 1100 is connected with the heat pipe 61 using a mounting member, the heat pipe 61 is also removable at will. As a result, the heat pipe 61 can change a cooling performance by being replaced with one having different material, or the like. It is also to be understood that each of the elements 120 through 140 can be replaced.

The cooling fan 130 rotates, produces airflow, and thereby forcefully cools the cooling fin 140. The cooling fan 130 includes a motor portion 132, a propeller portion 134 fastened to the motor portion 132. The motor portion 132 typically includes an axis of rotation, a bearing provided around the axis of rotation, a bearing house, and a magnet making up a motor, but since any structure known in the art may be applied to the motor portion 132, a detailed description will be omitted. However, in order to prevent heat transfer to the bearing house, a thermal insulation portion is preferably formed on an inner wall surface of the bearing house. The thermal insulating portion is, for example, formed of a low-thermal-conductivity material such as a fluoroplastic, a silicon resin, or the like into a thin film.

The propeller portion 134 includes a desired number of rotor blades each forming a desired angle. The rotor blades may be so oriented to form equal or unequal angles, and have a desired dimension. The motor portion 132 and propeller portion 134 in the cooling fan 130 may be separable or unseparable. An illustration of wiring connected with the cooling fan 130 is omitted. As described above, the intake 125 is provided at both sides (surfaces 122 and 124) of the housing 120, and thus the cooling fan 130 may take in air from the both sides.

The cooling fan 130 in the present embodiment is placed in the same plane as the cooling fin 140 that will be described below, and is designed to have a thin body. This may therefore allow the notebook PC 200 in which the cooling fan 130 is included to maintain a low-profile body of the base 220. Moreover, the heat sink 110 including the cooling fan 130 is placed in parallel with one surface (the surface 162) of the motherboard 160. This configuration also contributes to a reduced thickness of the base 220 in the notebook PC 200 that will be described later. As described above, the through hole 166 of the motherboard 160 is optionally located under the cooling fan 130.

The cooling fin 140, as shown in FIG. 4, includes many neatly aligned plate-shaped fins 142, and a base portion 144 that constitutes part of the housing 120. The cooling fin 140 includes a convex portion to increase the surface area thereof, thereby enhancing dissipating effects. However, the shape of the fins 142 is not limited to one like a plate, and any placement shapes like a pin, a curve, etc. may be adopted. The fins 142 do not necessarily have to be aligned horizontally with equal spacing, but may be placed so as to be radial, or oblique relative to the base portion 144 or the bottom surface 124. Moreover, the fins 142 may be placed around the cooling fan 130. The number of the fins 142 may be set arbitrarily. The fins 142 are preferably made of a high-thermal-conductivity material such as aluminum, copper, aluminum nitride, artificial diamond, and plastic. The fins 142 are formed by molding, a press fit, brazing, welding, injection molding, or the like.

The base portion 144 constitutes part of the housing as shown in FIG. 4, and serves as a heat-receiving surface for heat from the CPU 150 that will be described later. Therefore, the base portion 144 needs to come in absolute contact with the CPU 150 to ensure excellent thermal conductivity. A back side of the heat-receiving surface of the base portion 144 is connected with many fins 142. The base portion 144 may preferably be made of high-thermal-conductivity material such as aluminum, copper, aluminum nitride, artificial diamond, and plastic. Moreover, the base portion 144 may be formed singly, or integrated with the fins 142. A single-piece construction of the fins 142 and the base portion 144 would reduce thermal resistance, thereby improving the thermal conductivity.

The base portion 144 is formed by molding, a press fit, brazing, welding, injection molding, or the like. In the present embodiment, a hole 146 is formed in a portion of the housing 120 in which the base portion 144 is fitted, and the base portion 144 constitutes part of the housing 120. However, the base portion 144 does not necessarily have to constitute part of the housing 120, but may be connected to the bottom surface 124 of the housing 120.

A description will now be given of a method of manufacturing the cooling fin 140. Among conventional methods of manufacturing the cooling fin 140, a method of working a metal material is in common use, and among working methods are a forging process, and a stamping process. The forging or stamping process can integrally form the fins 142 and the base portion 144. The forging process is a method that a lump of heated metal is pressurized to form projections and depressions. For instance, the cooling fin 140 shown in FIG. 4 may be formed in such a manner that a die having desired projections and depressions is formed, and the cooling fin 140 may be pressed in the die. The forging process does not include the step of stamping or melting a metal material, and thus may be formed without losing stiffness because grain flow thereof is shaped along the die.

Figure 5:
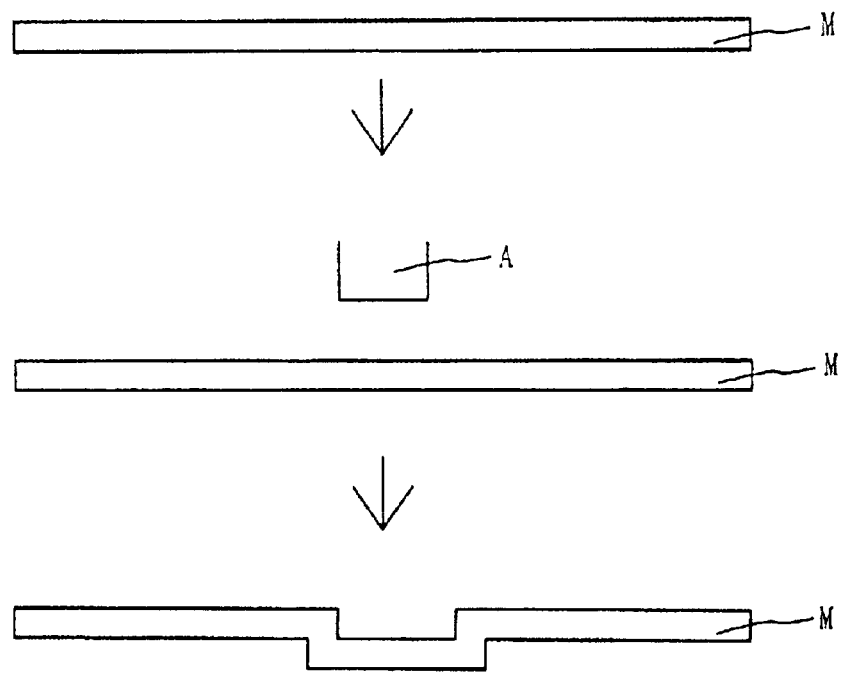
FIG. 5 is an overview for explaining a process of stamping.
Figure 6:
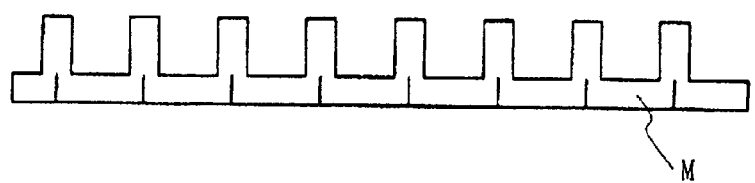
FIG. 6 is a sectional view of a cooling fin formed by the process shown in FIG. 5.

Next, a description will be given of the stamping process by making use of FIGS. 5 and 6. FIG. 5 is an overview for explaining the process of stamping. FIG. 6 is a sectional view of the cooling fin 140 formed by the process shown in FIG. 5. Referring to FIG. 5, the cooling fin 140 is manufactured from a sheet of metal M. The stamping process employs, for instance, a progressive die having a square-shaped press member A. First, as shown in FIG. 5, the sheet of metal M is pressed using the square-shaped press member A, and a concave portion is formed thereon. The progressive die presses the press member A in sequence, and thereby forms concave portions one after another on the sheet of metal M. Consequently, on the sheet of metal M, as shown in FIG. 6, a desired number of concave portions are formed, and the fins 142 as convex portions corresponding to the concave portions are formed.

In the storage portion 128, the CPU 150 is located immediately below a position in which the cooling fin 140 is placed. In other words, in a portion surrounded with the mounting holes 123b and the mounting grooves 123a in the storage portion 128, the cooling fin 140 is formed. As described above, the cooling fin 140 (the base portion 144 thereof) and the CPU 150 are thermally connected, and consequently heat from the CPU 150 is efficiently transferred to the cooling fin 140. Moreover, the cooling fin 140, which receives air blowing from the cooling fan 130, may efficiently dissipate heat.

The cooling fin 140 serves as a heat exchanger, and thus is required to have more excellent conductivity than other components constituting the fan-cum-heat sink 110. Particularly, in order to improve the cooling effect, the most efficient way is to change the shape, size, material, or the like of the cooling fin 140. In addition, the cooling fin 140 needs no electric connection as the cooling fan 130 does, and therefore may be considered as a relatively easy-to-replace member. Accordingly, the inventive heat sink 110 may have the housing 120 and cooling fin 140 that was conventionally formed in one piece separated, and therefore can replace the cooling fin 140 alone.

In the cooling fin 140 in the present embodiment, the fins 142 are integrally formed on the board 144. The cooling fin 140 is, for example, connected with the housing 120 by an adhesive. For the adhesive, a high-thermal-conductivity adhesive is employed. Further, the cooling fin 140 may establish the connection in such a manner as to be sandwiched between the bottom surface 124 of the housing 120 and the CPU 150. In this case, the base portion 144 of the cooling fin 140 is formed to have a larger area than the hole 146 provided in the housing 120. According to this mounting method, another mounting member need not be provided for the cooling fin 140, and thus a mounting process can be simplified.

The fan-cum-heat sink 110 according to the present invention is configured to include a housing 120, a cooling fan 130, and a cooling fin 140 individually and separately, and thus the cooling capability can be controlled to attain a desired level by changing a combination thereof. Therefore, the beat sink 110 may make fine adjustments when placed to the exoergic components having various shapes and calorific values, and to placement space having various shapes and dimensions. Accordingly, different heat sinks need not be designed for every electronic apparatus, so that the manufacturing costs for the electronic apparatus can be prevented from increasing.

A conventional fan-cum-heat sink also includes a removable cooling fan. However, if the use of a larger cooling fan were desired in order to enhance a cooling efficiency, replacement of the cooling fan would be extremely difficult because of the structure of the mounting member on the housing or the size of the propeller portion. Therefore, conventionally the cooling fan was not replaced, and the whole heat sink was replaced, instead. Moreover, even when the cooling fan was damaged, the whole heat sink uneconomically need be replaced. However, the inventive fan-cum-heat sink 110 is made up of the housing 120 having the shape conforming to some of the cooling fans available among which one is selected when replaced, and thus is more economical than the conventional heat sink which requires replacing a whole unit. In addition, the heat sink 110 can be configured with consideration given to the compatibility of the elements 120 through 140 with each other for cooling performance optimization, which therefore enables a higher-performance cooling.

The inventive fan-cum-heat sink 110 may reduce its own weight by changing materials or the like of the elements 120 through 140. For example, if the cooling fin 140 changes the material from copper (Cu) to aluminum (Al) while keeping the shape, the weight becomes one third or less. Such weight reduction of the fan-cum-heat sink 110 would lead to the weight reduction of the notebook PC 200 having the heat sink 110, which will be described later.

Further, this invention is applicable not only to the fan-cum-heat sink 110, but also to a heat sink 10*a* comprised of a housing 120 and a cooling fin 140. For instance, the weight reduction of the heat sink 10*a* would be effectively achieved by changing the material of the heat sink 10*a* from copper (Cu) to aluminum (Al). However, aluminum is lower in thermal conductivity than copper, and thus heat exchange performance would possibly lower. In this respect, the cooling fin 140 made of copper is left unchanged to ensure high thermal exchange performance, and the housing is replaced with one made of aluminum, thereby reducing the weight. In this manner, the weight reduction without loss of cooling performance would become possible.

A brief description will be given of a method of manufacturing the fan-cum-heat sink 110. First, the housing 120 is formed, for example, by the aluminum die-casting process. Thereafter, the cooling fan 130 formed by another process is mounted in the housing 120. At that moment, the housing 120 is provided with a lead drawing hole, through which the cooling fan 130 and a lead of the motherboard 160 are connected with each other. Therefore, the cooling fan 130 is electrically connected with the motherboard 160. Next, the cooling fin 140 is fitted into the housing 120 and fastened, for example, with an adhesive or the like, whereby the fan-cum-heat sink 110 is manufactured. After manufacturing, the heat sink 110 may replace each element 120 through 140, for example, to improve the cooling performance, to change a damaged element, or to reduce weight.

Each element 120 through 140 of the fan-cum-heat sink 110 formed by the above manufacturing method is manufactured separately, and combined as appropriate so as to be adjusted to exoergic components having various shapes and calorific values, and to placement space of various shapes and dimensions, thereby increasing design flexibility at a development stage. In addition, the development as to each element 120 through 140 may be separately carried out, thereby speeding up the development.

The fan-cum-heat sink 110 in the present embodiment is, in general, higher in radiative efficiency than a heat sink configured to have the cooling fan 130 placed above the cooling fin 140. This is: (1) because the cooling fan above the cooling fin blocks air from the propeller portion, reducing the amount of air to the cooling fin immediately below the motor portion, and inhibits effective cooling performance; (2) because heat producing sources in a CPU concentrate in a central portion thereof; and for other reasons.

Further, this structure allows the fan-cum-heat sink 110 itself to be made slim, and is thus suitable for a low-profile notebook PC. Furthermore, this structure may allow the through hole 166 of the motherboard 160, which is optionally provided, to be easily connected to the cooling fan 130. However, it is to be understood that the cooling fan 130 and the cooling fin 140 need not be disposed in the same plane, as far as connection established between the cooling fan 130 and the through hole 166 in the motherboard 130 is secured.

Optionally, a thermally conductive elastic body (e.g., silicon rubber) may be inserted between the cooling fin 140 and the top surface 122 so that heat conducts therebetween to enhance a radiative efficiency. This structure also serves to eliminate a vibration in the cooling fin 140 caused by a rotation of the cooling fan 130 and a noise accompanied by the vibration. The thermally conductive elastic body's absorption of the vibration accompanied by the rotation of the cooling fan would eventually prevent screws 170 from working loose.

The motherboard 160 is a printed board mounted with circuit components such as a CPU socket 151, a variety of memory (sockets), a chipset, an expansion slot, and a BIOS ROM, and includes a front surface 162, a back surface 164, and a through hole 166 that is pierced through the both surfaces 162 and 164. The through hole 166, which may be provided at will, is herein provided for the purpose of more effectively cooling the both surfaces 162 and 164 of the motherboard 160. In FIGS. 1 and 2, other circuit components to be mounted on the motherboard 160 are omitted.

Close to the CPU socket 151 are disposed a memory (SRAM, or the like), and a chipset for CPU. The chipset for CPU, which connects the CPU 150 and the memory with each other, serves to control dataflow between the CPU 150 and the memory, and is typically disposed between the CPU 150 and the memory. Both the memory and the chipset for CPU are exoergic components. The through hole 166 is provided so as not to interfere with the placement of the memory and the chipset for CPU.

The through hole 166 has a diameter of at least about 8 mm or larger, and preferably about 10 mm or larger, to provide ventilation with the back surface 164. The "about 8 mm" is intended to exclude a screw hole and inspection hole that are typically provided on the motherboard 160. Because these screw hole and the like are too small to provide ventilation. Although the through hole 164 is provided in the shape of a circle in the present embodiment, applicable shapes are not limited to this, but may include any shape such as an ellipse, and a polygon. In other words, the through hole 166 has an area of at least about 16 δ mm² or larger, and preferably about 25 δ mm² or larger. The through hole 166 need be connected to the cooling fan 130. The "connect" means that the cooling fan 130 is allowed to provide ventilation via the through hole 166 with the back surface 164.

The through hole 166 may be one hole having the above area, but may also be separated into multiple holes having the total area enough to meet the above area requirement when each area of the holes is summed up. In that event, the multiple holes are preferably provided in proximity to each other. The proximity should be an extent enough to secure connection between each hole and the cooling fan 130. For instance, the through hole 166 may be a mesh of holes provided on the motherboard 166. The shape and dimension of each hole may be the same as each other, or different from each other.

Figure 7:
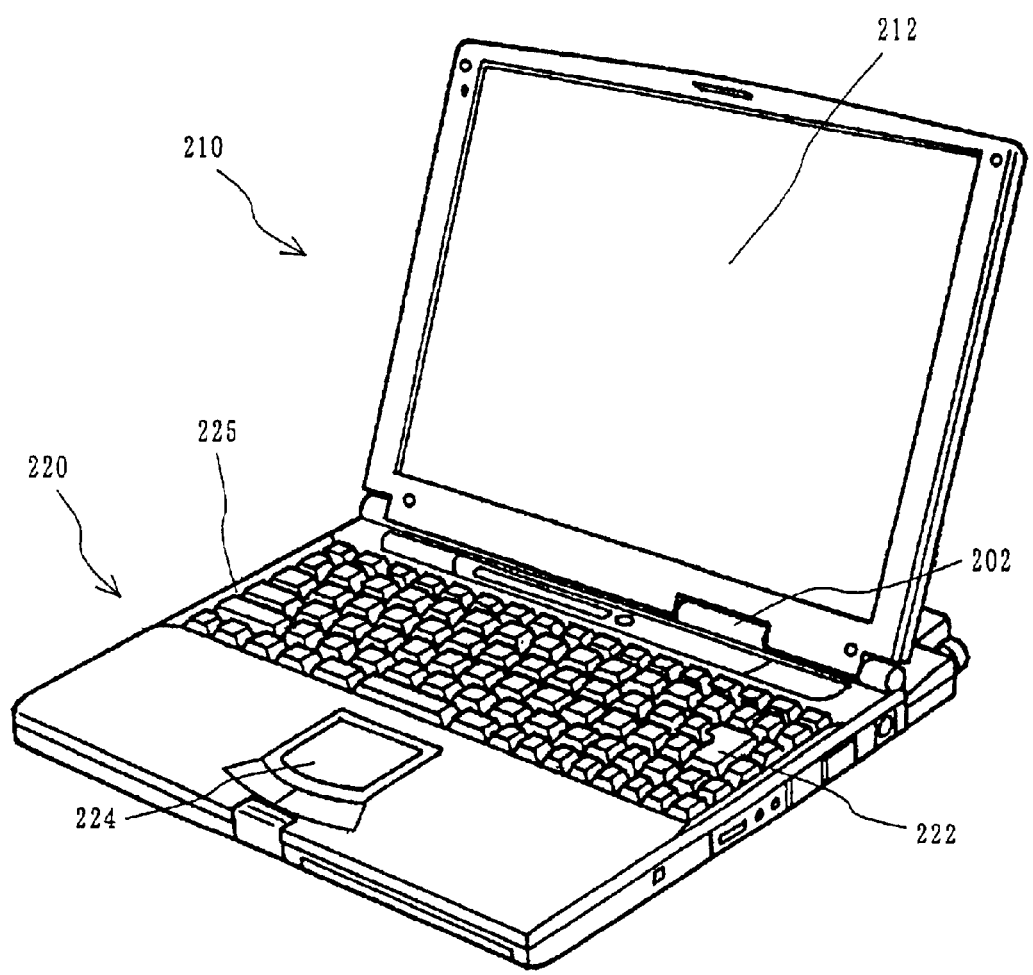
FIG. 7 is a schematic perspective view of a notebook personal computer to which the radiator mechanism shown in FIG. 1 is applicable.

An operation of the radiator mechanism 100 will be described herein, as an operation of the notebook PC 200 to which the radiator mechanism 100 is applicable. A description will now be given of the operation of the notebook PC 200, with reference to FIG. 7. FIG. 7 is a schematic perspective view of the notebook PC according to the present invention. As shown in FIG. 7, the notebook PC 200 includes a liquid crystal display (LCD) bezel frame 210 and the base 220 connected with each other via a hinge 202. The LCD bezel frame 210 is provided with an LCD screen 212. Characteristically, the base 220 is made of plastic material, having a thickness of about 50 mm or less, and preferably of about 20 through about 30 mm. The inventive radiator mechanism 100 employs the fan-cum-heat sink 110, which does not dispose the cooling fan 130 above the cooling fin 140, but in the same plane, and thus maintain a low-profile body of the base 220. The LCD bezel frame 210 takes on substantially a rectangular shape so as to hold the LCD screen 212.

The base 220 includes a keyboard section 222 for typing information in, and the keyboard may use any type and arrangement. Usable types of the keyboard may include 101, 106, 109 and ergonomics, and usable key arrangements include QWERTY, DVORAK, JIS, new-JIS, and NICOLA (Nihongo Nyuryoku Conthotium Layout).

The base 220 also includes a pointing device 224 that emulates part of mouse functions. Despite the structure shown in FIG. 7, the pointing device 224 may include a mouse, a trackball, a trackpad, a tablet, a digitizer, a joystick, a joypad, a touch panel, and a stylus pen.

Moreover, the base 220 includes sheet metal for heat radiation and/or exhaust port (not shown) incorporated in a side portion 225. The sheet metal for heat radiation and/or exhaust port is connected to the exhaust port 127. To be specific, the bottom surface 124 near the exhaust port 127 may be connected with the sheet metal for heat radiation, and air emitted from the exhaust port 127 may be blown on the sheet metal for beat radiation, or emitted out from the exhaust port at the side portion; 225. The temperature of the fan-cum-heat sink 110, if connected with the sheet metal for heat radiation, constantly keeps an approximately specific value (eg., at room temperature).

In operation, a user of the notebook PC 200 operates the keyboard 222 or the pointing device 224, and executes a program stored in a hard disk (not shown) included in the base 220. In that event, the CPU 150 downloads necessary data from the hard disk and ROM (not shown) into memory (not shown). Heat produced from the CPU 150 in that moment is thermally transferred via the thermally coupled housing 120 of the fan-cum-heat sink 110, and bottom surface 124 of the housing 120, to the cooling fin 140. As a result, the heat is air-cooled by itself at a surface of the cooling fin 140 and the housing 120. Moreover, air blown from the cooling fan 130 forcefully cools the cooling fin 140.

Hot air derived from the memory, CPU chipset, other exoergic components mounted on the front surface 162 of the motherboard 160 is introduced from the intake 125 to the inside of the housing 120 by the cooling fan 130 without passing through the through hole 166. The introduced hot air is exhausted from the storage portion (wind tunnel space) 128 to the exhaust port 127 by the cooling fan 130. The hot air is cooled by heat exchange with the cooling fin 140 and the housing 120 while passing through the storage portion 128. The cooling fin 140 is forcefully cooled by the cooling fan 130 as described above. Then, the air exhausted from the exhaust port 127 is blown to the sheet metal for heat radiation, and further cooled, or exhausted out from the exhaust port provided at the side portion 225.

Hot air derived from the exoergic components mounted on the back surface 164 of the motherboard 160 is introduced from the intake 125 via the through hole 166 to the inside of the housing 120 by the cooling fan 130. The introduced hot air is exhausted from the storage portion (wind tunnel space) 128 to the exhaust port 127 by the cooling fan 130. The hot air is cooled by heat exchange with the cooling fin 140 and the housing 120 while passing through the storage portion 128. The cooling fin 140 is forcefully cooled by the cooling fan 130 as described above. Then, the air exhausted from the exhaust port 127 is blown to the sheet metal for heat radiation, and further cooled, or exhausted out from the exhaust port provided at the side portion 225.

Consequently, the CPU 150 and other circuit components are thermally protected, regardless of whether on the front surface 162 or the back surface of the motherboard 160. The fan-cum-heat sink 110 may make a fine adjustment upon placement to exoergic components having various shapes and calorific values, and to placement space of various shapes and dimensions, thereby ensuring an appropriate cooling capability to thermally protect each component. Accordingly, the circuit components in the notebook PC 200 does not suffer destruction, deterioration, or malfunction due to heat, and thus a user may carry out an intended process. Moreover, the base 220 made of a plastic material also does not result in thermal deformation or low-temperature burn.

Although the fan-cum-heat sink 110 in the present embodiment, as has been exemplarily described above, takes in air from both of the top and bottom surfaces of the motherboard 160, and exhausts the air from the exhaust port 127, the air may flow in the reverse direction. In this case, the exhaust port 127 is utilized as an intake, and the fan-cum-heat sink 110 exhausts the air from both of the top and bottom surfaces of the motherboard 160.

Although the preferred embodiments of the present invention have been described above, the present invention is, needless to say, not restricted to these a embodiments, and it is to be understood that various modifications and changes may be made without departing from the spirit and scope thereof. For example, the electronic apparatuses to which the inventive radiator mechanism is applicable are not limited to the notebook PCs, but may broadly include desktop PCs, word-processors, personal digital assistants (PDAs), or other portable electronic apparatuses (such as portable game machines, and various types of drives)

According to the inventive heat sink, method of manufacturing the same, and electronic apparatus, the housing and the cooling fin may be independently developed in a plurality of types, and an arbitrary selection and combination of these types would allow a fine and inexpensive adjustment to be made to the above requirements. In addition, only the element that needs replacing may be replaced, and thus the inventive heat sink is more economical than a conventional structure that requires replacing a whole unit.

What is claimed is:

1. A heat sink that cools an exoergic part, comprising:
   a cooling fin that receives and dissipates heat from the exoergic part, said cooling fin having been selected from plural kinds of cooling fins so as to be suitable to cool the exoergic part;
   a housing that accommodates said cooling fin, said housing having been selected from plural kinds of housings so as to be suitable to cool the exoergic part, said cooling fin being separably coupled with said housing before receiving and dissipating heat from the exoergic part; and
   further comprising a cooling fan that cools said cooling fin, said cooling fan absorbing air from a first direction and exhausting the air in a second direction that is approximately perpendicular to the first direction.

2. A heat sink according to claim 1, further comprising a base portion having front and back surfaces, said cooling fin being formed at the back surface, and said front portion receiving heat from the exoergic part.

3. A heat sink according to claim 1, wherein said cooling fin is removable from said base portion.

4. An electronic apparatus comprising:
   a printed board on which an exoergic part is mounted; and
   a heat sink that is provided onto said printed board near the exoergic part, and cools said exoergic part, wherein said heat sink comprises:
   a cooling fin that receives and dissipates heat from the exoergic part, said cooling fin having been selected from plural kinds of cooling fins so as to be suitable to cool the exoergic part;
   a housing that accommodates said cooling fin, said housing having been selected from plural kinds of housings so as to be suitable to cool the exoergic part, said cooling fin being separably coupled with said housing before receiving and dissipating heat from the exoergic part; and
   further comprising a cooling fan that cools said cooling fin, said cooling fan absorbing air from a first direction and exhausting the air in a second direction that is approximately perpendicular to the first direction.

5. A heat sink for cooling an exoergic part, comprising:
   a housing formed by generally rectangularly disposed walls including a top wall surface, a bottom wall surface, and walls extending between the top wall and the bottom wall on at least three sides of said housing to enclose a storage portion of said housing and to provide an exhaust part therein,
   a rotatable fan positioned within the housing adjacent one end thereof and including a motor operably connected to said fan for imparting rotation thereto,
   intake defined by an opening disposed in at least one of said top and bottom wall surfaces in alignment with said fan,
   a hole formed in one of said wall surfaces spaced from said intake and disposed adjacent said exhaust port, and
   a cooling fin that receives heat from the exoergic part including a base portion removably disposed with respect to said housing and a plurality of fins upstanding from said base portion and received through said hole into said storage portion of said housing,
   said cooling fin base portion is detachably secured with respect to one of said housing forming wall surfaces,
   wherein said intake means comprises openings disposed in both of said top and bottom wall surfaces in alignment with said fan.

6. A heat sink according to claim 5, wherein a wall extending between the top wall surface and the bottom wall surface of said housing is arcuately formed substantially concentric with said fan.

7. A heat sink according to claim 5, wherein said cooling fin base portion has a peripheral edge sized greater than said hole in said one wall surface, holds said base portion adjacent said peripheral edge against said housing wall surface.

8. A heat sink according to claim 5, wherein said cooling fins are separable from said base portion.

9. A heat sink according to claim 5, wherein said cooling fins are formed integrally with said base portion.

10. An electronic apparatus comprising, in combination:
    a printed board on which an exoergic part is mounted; and
    a heat sink disposed on said printed board for cooling the exoergic part, wherein said heat sink comprises:
    a housing formed by generally rectangularly disposed walls including a top wall surface, a bottom wall surface, and walls extending between the top wall and the bottom wall on at least three sides of said housing to enclose a storage portion of said housing and to provide an exhaust part therein,
    a rotatable fan positioned within the housing adjacent one end thereof and including a motor operably connected to said fan for imparting rotation thereto,
    intake defined by an opening disposed in at least one of said top and bottom wall surfaces in alignment with said fan,
    a hole formed in one of said wall surfaces spaced from said intake and disposed adjacent said exhaust port,
    a cooling fin that receives heat from the exoergic part including a base portion removably disposed with respect to said housing and a plurality of fins upstanding from said base portion and received through said hole into said storage portion of said housing, and said cooling fin base portion is detachably secured with respect to one of said housing forming wall surfaces, wherein said cooling fin base portion has a peripheral edge sized greater than said hole in said one wall surface, said base portion being sandwiched between said printed board and said one wall surface for holding said base portion against said housing wall surface.

11. A heat sink for cooling an exoergic part, comprising:

a housing formed by generally rectangularly disposed walls including a top wall surface, a bottom wall surface, and walls extending between the top wall and the bottom wall on at least three sides of said housing to enclose a storage portion of said housing and to provide an exhaust part therein;

a rotatable fan positioned within the housing adjacent one end thereof and including a motor operably connected to said fan for imparting rotation thereto, intake defined by an opening disposed in at least one of said top and bottom wall surfaces in alignment with said fan;

a hole formed in one of said wall surfaces spaced from said intake and disposed adjacent said exhaust port;

a cooling fin that receives heat from the exoergic part including a base portion removably disposed with respect to said housing and a plurality of fins upstanding from said base portion and received through said hole into said storage portion of said housing, and means for detachably securing said cooling fin base portion with respect to one of said housing forming wall surfaces, wherein said cooling fin base portion has a peripheral edge sized greater than said hole in said one wall surface, holds said base portion adjacent said housing wall surface.

* * * * *